United States Patent [19]
Roselle

[11] Patent Number: 5,230,771
[45] Date of Patent: * Jul. 27, 1993

[54] PLASMA ETCHING INDIUM TIN OXIDE USING A DEPOSITED SILICON NITRIDE MASK

[75] Inventor: Paul L. Roselle, Webster, N.Y.

[73] Assignee: Eastman Kodak Company, Rochester, N.Y.

[*] Notice: The portion of the term of this patent subsequent to Jul. 16, 2008 has been disclaimed.

[21] Appl. No.: 716,486

[22] Filed: Jun. 17, 1991

Related U.S. Application Data

[63] Continuation-in-part of Ser. No. 681,837, Apr. 8, 1991, abandoned.

[51] Int. Cl.$^5$ .............................................. B05D 1/00
[52] U.S. Cl. ................................... 156/643; 156/646; 156/657; 156/659.1; 156/661.1; 156/667
[58] Field of Search ............ 156/643, 646, 657, 661.1, 156/659.1, 667

[56] References Cited

U.S. PATENT DOCUMENTS 4,878,993 11/1989 Rossi et al. ........................ 156/643
5,032,221 7/1991 Roselle et al. ..................... 156/643

Primary Examiner—Thi Dang
Attorney, Agent, or Firm—Raymond L. Owens

[57] ABSTRACT

The use of a deposited silicon nitride mask permits higher power to be used when ITO is etched by a plasma containing $CH_3$. and $Ar^+$ thereby increasing the etch rate of ITO.

1 Claim, 2 Drawing Sheets

PLASMA ETCHING INDIUM TIN OXIDE USING A DEPOSITED SILICON NITRIDE MASK

This is a continuation-in-part of application Ser. No. 681,837, filed Apr. 8, 1991, now abandoned.

Reference is made to U.S. patent application Ser. No. 533,217, filed Jun. 4, 1990 to Paul Roselle; U.S. patent application Ser. No. 520,486, filed May 7, 1990 to Paul Roselle, Gustavo Paz-Pujalt and Ronald Wexler, now U.S. Pat. No. 5,032,221 U.S. patent application Ser. No. 533,232, filed Jun. 4, 1990 to Paul Roselle, now U.S. Pat. No. 5,171,401; the disclosure of which are incorporated by reference herein.

FIELD OF THE INVENTION

The present invention relates to the plasma etching of indium tin oxide.

BACKGROUND OF THE INVENTION

Solid state CCD image sensors often employ a double polysilicon gate structure to form the sensor electrodes. Such a structure has the first polysilicon electrode (poly-1) separated from the second polysilicon electrode (poly-2) by a thin insulating layer of silicon dioxide. Poly-1 is slightly overlapped by poly-2. The systematic variation of the potential applied to these electrodes, referred to as clocking, permits the device to function. In the case of frame transfer CCD image sensors, light passes through the polysilicon electrodes and creates electron hole pairs in the underlying silicon. These electrons are accumulated prior to clocking the polysilicon electrodes to remove the accumulated charge. The polysilicon electrodes, through which light must pass, are not entirely transparent. This lack of transparency results in the reduction of sensitivity and spectral response of the image sensor.

Due to its transparency, it has been recognized that indium tin oxide would be an effective electrode for such a device. The use of an indium tin oxide electrode enhances the blue response and overall sensitivity of a frame transfer image sensor. In fact, it has been recognized that if indium tin oxide where to be used in such a device the effective ASA of the device could be increased by as much as a factor of two. One reason that ITO has not been used on such devices is because it is difficult to pattern such material. Heretofore, the only practical method for etching indium tin oxide has been by immersion in a hot hydroiodic acid solution. Such an acid etches the material isotropically and is not selective to photoresist. These two reasons alone show the difficulties involved in using ITO for microelectronic applications where small features are defined by photoresist lithography.

It has also been recognized that ITO can be used as antistatic coating on materials such as webs used in the manufacture of photosensitive materials. Thereagain, it is difficult to use such a material because it is not practical to pattern it.

SUMMARY OF THE INVENTION

It is the object of this invention to provide a new method for the etching of indium tin oxide.

A plasma containing methyl radicals ($CH_3 \cdot$) and Ar ions can effectively etch indium tin oxide anisotropically. By using a deposited silicon nitride mask, in place of a photoresist mask, the masking silicon nitride is not attacked by the process so higher etch power can be used resulting in higher ITO etch rates (600-700 A/min.).

The above object is achieved in a method of etching a layer of ITO on a substrate, comprising the steps of:
forming a deposited silicon nitride layer on the ITO layer;
coating and patterning a microlithographic photoresist layer on the deposited silicon nitride layer to expose portions of the deposited silicon nitride layer;
etching the exposed deposited silicon nitride portions and removing the patterned photoresist layer; and
igniting a plasma containing $CH_3 \cdot$ where the $CH_3 \cdot$ etch the exposed ITO portion thereby transferring the pattern into the ITO, anisotropically.

The advantage of use silicon nitride as an etch mask instead of an oxide mask is that the silicon nitride mask can be removed after the etch using an $SF_6$ plasma etch which is selective to the gate oxide and the ITO.

DESCRIPTION OF THE PREFERRED EMBODIMENTS

With reference to FIGS. 1, 2 and 3a-c, a process for the plasma etching of indium tin oxide is described.

A plasma is a state of matter in which the gases in a vessel with a total pressure less than atmospheric pressure are partially ionized by an electric field. As is well understood, such an electric field can be from a radio frequency generator, microwave frequency generator or DC voltage field.

A plasma, ignited by the action of such an electric filed on a mixture of $CH_4$ gas, and Ar gas, will contain methyl radicals ($CH_3 \cdot$) as well as other species generated from the cracking of the molecules of $CH_4$. As in any plasma, the concentrations of the various species in the plasma depend upon the power and frequency of the electric field applied, the pressure of the plasma, and the concentrations of the gases used. The selectivity of the plasma to photoresist is also dependent upon the process parameters used. Power is an especially critical parameter in that higher powers result in higher ITO etch rates but also cause photoresist reticulation for this process. Higher powers do not affect $SiO_2$ etch rates. It should be understood that $CH_4$ and Ar mixtures are not the only means of producing methyl radicals ($CH_3 \cdot$) and that mixtures of ethane, propane, or other organic compounds will result in methyl radical creation in plasma and will, in so doing, etch ITO.

Figure 1:
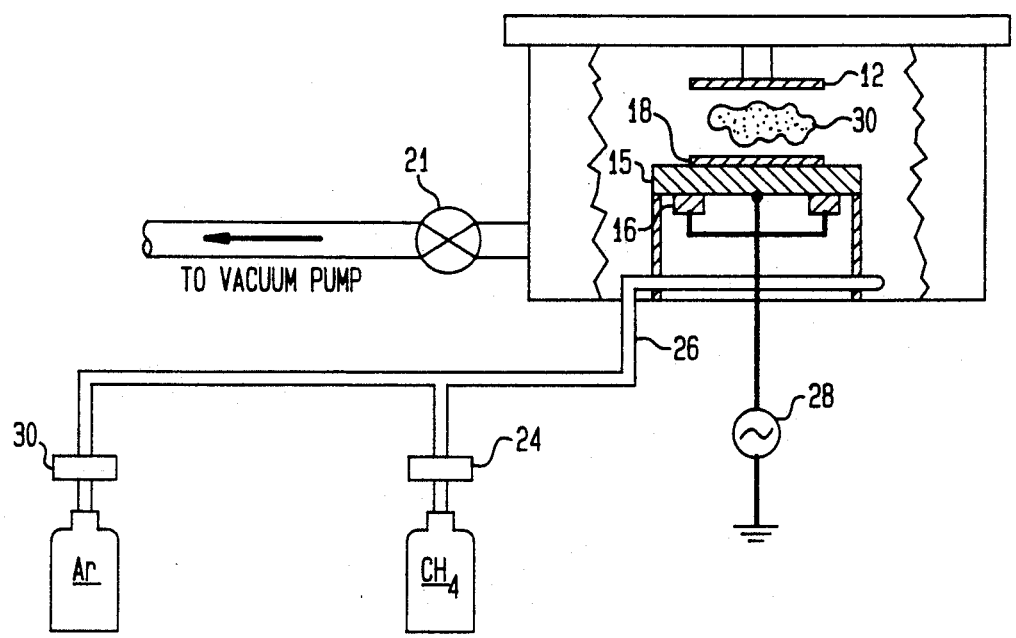
FIG. 1 is a schematic, in partial cross-section, of a conventional plasma etcher which uses radio frequency energy to ignite and sustain the plasma.

For an etcher as represented in FIG. 1, a wafer 18 is placed on a lower electrode 15 which is connected to an RF radiation source 28. Vacuum is achieved in the chamber by the use of an oil diffusion pump and rotary vacuum pump, not shown. The lower electrode 15 is heated by resistive heaters 16 located on the back of the electrode. The $CH_4$ and Ar gases are admitted into the chamber through a diffuser 26. The flows of the gases are regulated by mass flow controllers 24 and 30. Process pressure in the vessel is controlled by a vacuum throttle valve 21. When the desired flow rates, pressure and temperature are achieved, a plasma of CH$_4$ and Ar is ignited in a space 30 between the lower electrode 15, on which the wafer 18 sits, and an upper electrode 12. The resultant CH$_3\cdot$ generated in region 30 will react with the ITO on the wafer 18 volatilizing the ITO off the wafer to be pumped away by the vacuum pump. The partial pressure of CH$_4$ must be maintained below the polymerization point of the plasma. Such polymerization produced by too high of a pressure and/or too high of a concentration of CH$_4$ will prevent ITO from etching uniformly. The use of Ar is effective in achieving higher etch rates through ion bombardment of the surface of the ITO.

Figure 2:
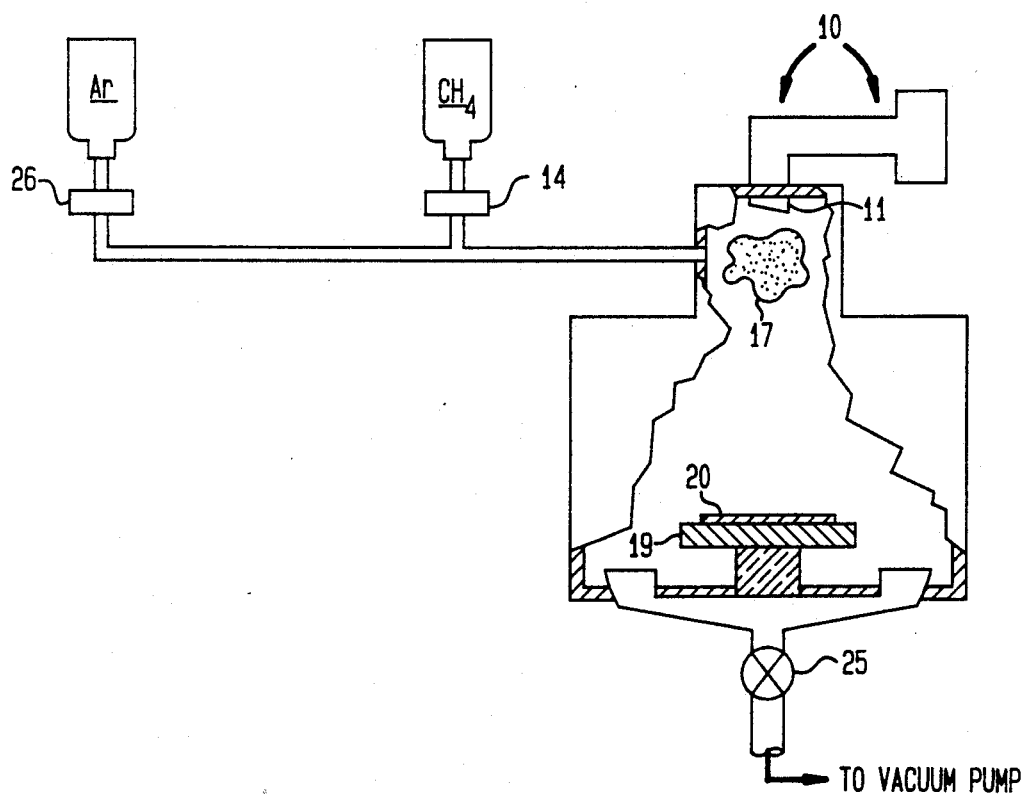
FIG. 2 is a schematic, in partial cross-section, of another plasma etcher which uses microwave energy to ignite and sustain the plasma.

For an etcher system as represented in FIG. 2, the source of the plasma excitation is a microwave generator 10 located on top of the vacuum chamber. A wafer 20 is placed on a lower electrode 19 which can be biased by an additional power source if needed. Vacuum is achieved with a vacuum pump (not shown). CH$_4$ and Ar gases are admitted into the plasma generation region 17. The flows of the gases are controlled by mass flow controllers 14 and 26 and the pressure in the chamber is maintained by a throttle valve 25. When the plasma is to be ignited the microwave energy is sent into the plasma generating region 17 through a wave guide 11 where it partially ionizes the gases into a plasma state. The CH$_3\cdot$ species generated in this plasma travel to the wafer 20 and etch the exposed ITO off of the wafer.

Figure 3A:
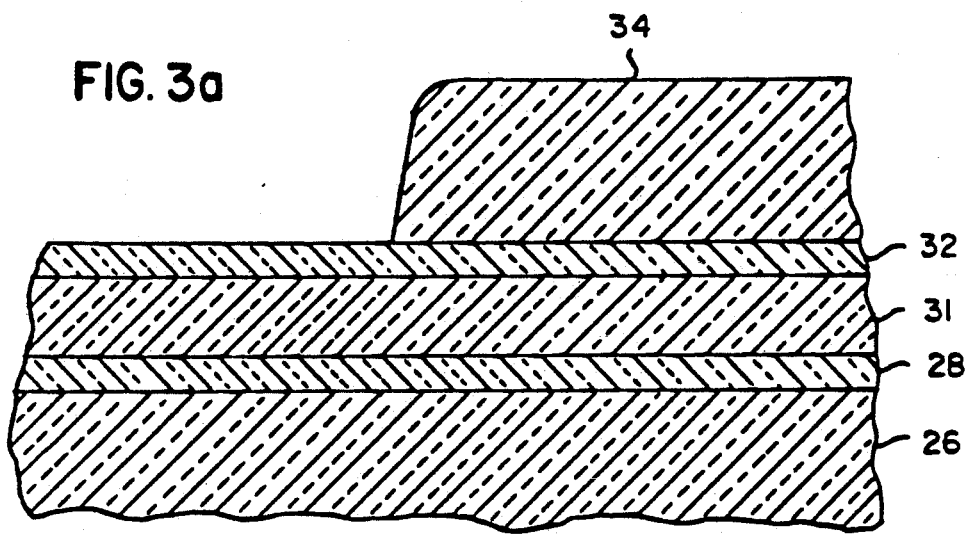
FIGS. 3a-c shows various steps in patterning an ITO layer employing a deposited silicon nitride mask formed on an $SiO_2$ insulating layer provided on a silicon substrate.
Figure 3B:
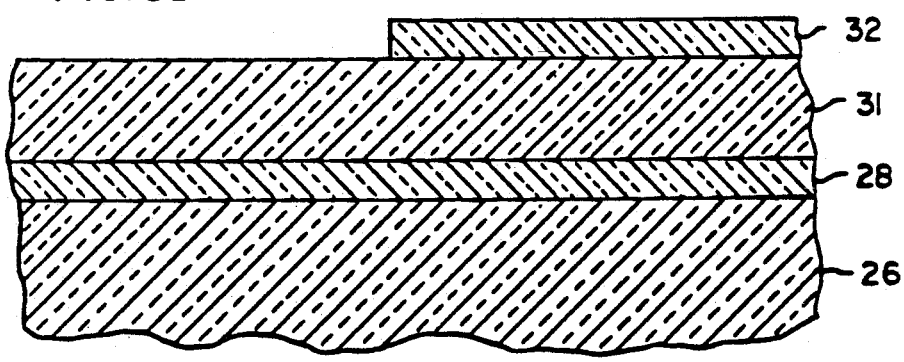
Figure 3C:
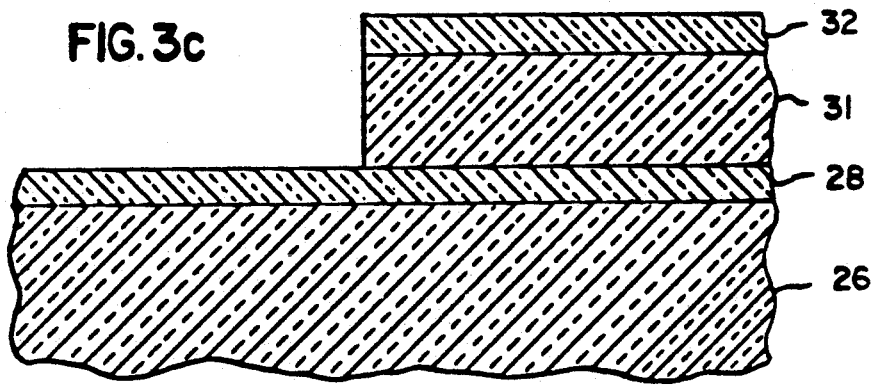

FIGS. 3a–c show the process of pattern transfer for the definition of ITO where the etched ITO is to be used as a gate electrode. In FIG. 3a it is seen that microlithographic photoresist mask 34 has been coated and patterned in a conventional manner on the surface of a deposited silicon nitride layer 32 which has been deposited on an ITO layer 31 deposited on an SiO$_2$ layer 28 on a silicon substrate 26. ITO is most usually deposited by RF sputter deposition. Silicon nitride can be deposited using conventional deposition techniques such as chemical vapor deposition, plasma enhanced vapor deposition and electron-cyclotron resonance based deposition.

In FIG. 3b the deposited silicon nitride layer 32 has been etched by either a conventional wet hot phosphoric silicon nitride etch or plasma silicon nitride etch, and thereafter the photoresist has been removed by a conventional O$_2$ plasma strip. This transfers the photoresist pattern into the deposited silicon nitride and exposes the ITO layer 31 for the next step. In FIG. 3c the ITO layer 31 has been etched anisotropically by the plasma of CH$_3\cdot$ and Ar$^+$ thereby transferring the deposited oxide pattern into the ITO and stopping on the SiO$_2$ layers 28. Measurements have shown that the plasma of CH$_3\cdot$ and Ar$^+$ that etches the ITO has a high selectivity to both the masking deposited silicon nitride 32 and the underlying SiO$_2$ layer 28. The silicon nitride mask can be then be removed using a an SF$_6$ plasma silicon nitride etch. The etch is selective to ITO and SiO$_2$.

EXAMPLE

Without limiting the generality of this invention, the mechanism of etching of ITO is believed to be caused by methyl radicals reacting with indium and tin to create volatile organometallic compounds as shown by the following reaction:

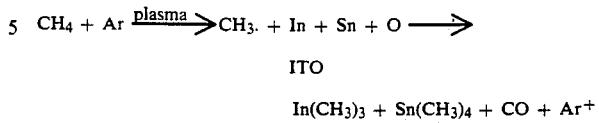

Other starting gases can be used provided they form a plasma having CH$_3\cdot$. The following is believed to be the mechanism which explains why ionized argon increases the etch rate. When ionized in the plasma, Ar$^+$ will strike the surface of the ITO with an energy that is derived from the RF power applied to the electrode on which the wafer resides. The mass of the argon ion combined with its incident energy results in bond breakage in the ITO being bombarded. This bond breakage in the ITO provides more chemically active sites where the CH$_3\cdot$ can react to form volatile products of ITO. Hence, the etch rate of ITO is increased when Ar is used in the plasma and increases with higher power.

An etcher similar to the one represented by FIG. 1 was used to etch ITO. The radio frequency used to ignite and sustain the plasma was 13.56 megahertz at 85 watts forward power. The wafer was heated to a temperature of 70° C. The chamber was evacuated to a base pressure of $1 \times 10^{-6}$ prior to the admission of the CH$_4$ and argon gases. The flow rate for the gases was 50 sccm for CH$_4$ gas and 95 sccm for Ar resulting in a total flow rate of 145 sccm. A process pressure of 75 Mtorr was maintained during the etch. The sputter deposited ITO etched at a rate of 600 angstroms per minute and the process showed very high selectivity to the deposited silicon nitride mask and the underlying silicon dioxide. Cross-sectional scanning electron micrographs of the etched ITO showed the etch to be highly anisotropic with no evidence of undercutting the deposited silicon nitride mask.

The invention has been described in detail with particular reference to a preferred embodiment thereof, but it will be understood that variations and modifications can be effected within the spirit and scope of the invention.

I claim:

1. A method of etching a layer of ITO on a substrate comprising the steps of:
   (a) depositing a silicon nitride layer on the ITO layer;
   (b) coating and patterning a microlithographic photoresist layer on the deposited silicon nitride layer to expose portions of the deposited silicon nitride layer;
   (c) etching the exposed deposited silicon nitride portions and removing the patterned photoresist layer; and
   (d) igniting a plasma containing CH$_3\cdot$ formed by mixing CH$_4$ and Argon in a chamber at a pressure selected to prevent excessive polymerization, ignition being effected by subjecting the mixture to RF or microwave radiation or other suitable electric field, thereby resulting in the CH$_3\cdot$ etching the exposed ITO portions and thereby transferring the pattern into the ITO, anisotropically and selectively.

* * * * *